(12) United States Patent
Tang et al.

(10) Patent No.: US 9,020,072 B2
(45) Date of Patent: Apr. 28, 2015

(54) METHOD FOR MODULATING NAVIGATION SIGNAL

(75) Inventors: Zuping Tang, Wuhan (CN); Jiaolong Wei, Wuhan (CN); Tao Yan, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 14/123,232

(22) PCT Filed: Mar. 27, 2012

(86) PCT No.: PCT/CN2012/073075
§ 371 (c)(1),
(2), (4) Date: Mar. 31, 2014

(87) PCT Pub. No.: WO2012/139458
PCT Pub. Date: Oct. 18, 2012

(65) Prior Publication Data
US 2014/0219393 A1    Aug. 7, 2014

(30) Foreign Application Priority Data

Apr. 15, 2011  (CN) .......................... 2011 1 0094974

(51) Int. Cl.
| | |
|---|---|
| *H03C 3/00* | (2006.01) |
| *H04L 27/32* | (2006.01) |
| *G01S 19/02* | (2010.01) |
| *G01S 19/37* | (2010.01) |
| *H04L 27/20* | (2006.01) |
| *H04L 23/02* | (2006.01) |
| *H04L 25/03* | (2006.01) |
| *H03D 3/26* | (2006.01) |

(52) U.S. Cl.
CPC .......... *H04L 27/32* (2013.01); *H04B 2215/065* (2013.01); *G01S 19/02* (2013.01); *G01S 19/37* (2013.01); *H04L 27/20* (2013.01); *H04L 23/02* (2013.01); *H04L 25/03* (2013.01); *H03D 3/26* (2013.01)

(58) Field of Classification Search
CPC .................................................. H04B 2215/065
See application file for complete search history.

(56) References Cited

U.S. PATENT DOCUMENTS 5,249,037 A * 9/1993 Sugiyama et al. ............ 348/452
6,661,851 B1 * 12/2003 Kang ............................ 375/322

(Continued)

*Primary Examiner* — Santiago Garcia
(74) *Attorney, Agent, or Firm* — Matthias Scholl P.C.; Matthias Scholl

(57) ABSTRACT

The present invention provides a method for modulating a navigation signal, comprising: multiplying a data channel difference signal between upper and lower sidebands by a sine binary subcarrier to obtain an odd timeslot baseband signal of a branch Q, and multiplying a data channel sum signal of the upper and lower sidebands by a cosine binary subcarrier to obtain an odd timeslot baseband signal of a branch I of the data channel; multiplying a pilot channel difference signal between the upper and lower sidebands by the sine binary subcarrier to obtain an even timeslot baseband signal of the branch Q, and multiplying a pilot channel sum signal of the upper and lower sidebands by the cosine binary subcarrier to obtain an even timeslot baseband signal of the branch I; and performing QPSK modulation on the baseband signals of the branch I and branch Q to obtain a TD-AltBOC modulation signal. The present invention can implement transmission of different navigation services at two adjacent frequency bands, and each navigation service comprises a data channel and a pilot channel. The navigation signal of each sub-band may be received independently, or signals of the upper and lower sidebands may be jointly received to obtain high-precision navigation performance.

4 Claims, 6 Drawing Sheets

(56) References Cited

U.S. PATENT DOCUMENTS

| | | | |
|---|---|---|---|
| 7,706,429 B2 * | 4/2010 | Chen et al. | 375/147 |
| 7,949,038 B2 * | 5/2011 | Avellone et al. | 375/150 |
| 8,374,223 B2 * | 2/2013 | Chen et al. | 375/150 |
| 2004/0041948 A1 * | 3/2004 | Collins et al. | 348/555 |
| 2008/0069187 A1 * | 3/2008 | Chen et al. | 375/148 |

* cited by examiner

METHOD FOR MODULATING NAVIGATION SIGNAL

CROSS-REFERENCE TO RELATED APPLICATIONS

This application is a National Stage Appl. filed under 35 USC 371 of International Patent Application No. PCT/CN2012/073075 with an international filing date of Mar. 27, 2012, designating the United States, and further claims priority benefits to Chinese Patent Application No. 201110094974.7 filed Apr. 15, 2011. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention relates to the signal system design and signal generation of a satellite navigation system, and more particularly to a method and system for modulating navigation signal.

2. Description of the Related Art

At present, signal modulation of satellite navigation has been developed from the first generation of BPSK modulation used by GPS into new modulation systems such as BOC, CBOC, TMBOC, and AltBOC. The AltBOC modulation system can bear different services in the upper and lower sidebands, which can not only receive and handle SSB signals independently to achieve the traditional BPSK signal performance, but also realize joint treatment to achieve higher positioning accuracy. Therefore, the AltBOC modulation system has been adopted by the COMPASS global system as the baseline for the modulation system of downgoing signals at the B2 frequency point.

AltBOC is a quasi BOC modulation system of which the upper and lower sidebands can modulate different pseudo-codes. AltBOC was first put forward in 2000, targeting to convey dual line navigation signals using one HPA on E1 and E2 frequency bands. However, owing to the non-constant envelope and signal planning and adjustment at L1 frequency band, AltBOC modulation system is not applied to L1 frequency band. In 2001, CNES put forward the AltBOC modulation system with 4-pseudo-code constant envelope, and was adopted as the modulation mode of navigation signal at GalileoE5a and E5b frequency band.

In COMPASS system, AltBOC (15, 10) modulation system whose center frequency is 1,191.795 MHz is adopted. The center frequency of a lower sideband is 1,176.45 MHz and that of an upper sideband is 1,207.14 MHz. This can not only realize the interoperation with GalileoE5 and GPSL5C signals, but also consider the compatibility with B2 signal in COMPASS district system. However, in order to achieve the modulation through 4-pseudo-code constant envelope, the AltBOC modulation system put forward by Galileo improves the conversion rate of baseband waveform to 8 times of the subcarrier, improves the level number of subcarrier to 4, and inserts product terms. The increase in baseband conversion rate and level of subcarrier will in no doubt multiply the complexity of signal generation and receiving. Introduction of product terms can reduce the multiplexing efficiency, which, to a certain extent, reduces the signal performance. With the smart design, CNES can keep the signal component near the subcarrier frequency not reduced, and ensure the performance of receiver is not damaged even when it only receives the main lobe power. However, the harmonic component of subcarrier can only modulate the useless product signals, so it reduces the performance under broadband receiving conditions.

SUMMARY OF THE INVENTION

In view of the above-described problems, it is one objective of the invention to provide a method and system for modulating navigation signal. The method and system has the advantages of flexible reception and treatment of signals, high MUX efficiency, and low complexity in signal generation, reception, and treatment.

To achieve the above objectives, in accordance with one embodiment of the invention, there is provided a method for modulating navigation signal, the method comprising the following steps:

1) dividing frequency of a control clock CLK0 to obtain a pseudo-code generating drive clock CLK1 and a time division multiplexing (TDM) control clock CLK2, where, a frequency of the control clock CLK0 is four times that of a binary subcarrier, a frequency of the pseudo-code generating drive clock CLK1 is ½ of a code rate, and a frequency of the TDM control clock CLK2 is equivalent to the code rate;

2) driving the CLK1 to generate pseudo-code $c_{BD}$ of a data channel of an upper sideband, pseudo-code $c_{AD}$ of a data channel of a lower sideband, and pseudo-code $c_P$ of a pilot channel; driving the CLK0 to generate a binary sine subcarrier $SC_{B,sin}$ and a binary cosine subcarrier $SC_{B,cos}$;

3) modulating the $c_{AD}$ by a lower sideband $d_A$ to generate a baseband signal component $C_A$ of the data channel of the lower sideband; modulating the $c_{BD}$ by an upper sideband waveform $d_B$ to generate a baseband signal component $C_B$ of the data channel of the upper sideband;

4) modulating the subcarriers, which comprising:

(4.1) negating the $C_A$ and adding to the $C_B$, and multiplying with the $SC_{B,sin}$ to get a signal component of data channel at Q branch; adding the $C_A$ to the $C_B$ and multiplying with the $SC_{B,cos}$ to get a signal component of data channel at I branch; multiplying the $C_P$ by 2 and then multiplying with the $SC_{B,cos}$ to get a signal component of the pilot channel at I branch;

(4.2) when the CLK2 is in a time slot of odd chip, allowing the signal component of the data channel at Q branch to be a signal component of a baseband signal at Q branch, and allowing the signal component of the data channel at I branch to be a signal component of a baseband signal at I branch; when CLK2 is in a time slot of even chip, allowing zero signal to be the signal component of the baseband signal at Q branch, and allowing the signal component of the pilot channel at I branch to be the signal component of the baseband signal at I branch; and (5) modulating a sine phase carrier by the signal component of the baseband signal at Q branch, modulating a cosine phase carrier by the signal component of the baseband signal at I branch, and combining the modulation result of the two branches to obtain a modulated radio frequency signal.

In step (4), corresponding baseband signal components at Q branch and I branch are looked up in a modulation mapping table according to the current $C_A$, $C_B$, and $C_P$ value; a method to establish the modulation mapping table comprises: combining all possible $C_A$, $C_B$ and $C_P$ values and processing each combination thereof according to steps (4.1)-(4.2) to get the baseband signal component at Q branch and I branch corresponding to each combination, and recording each combination and corresponding Q branch component and I branch component thereof to establish the modulation mapping table.

The invention provides a system for modulating navigation signal according the above-mentioned method. The system comprises:

a first multiplier 3, a first subtracter 4, a second multiplier 7, and a first time division multiplexer 11, which are connected in order;

a fourth multiplier 2, a second adder 5, a fifth multiplier 8, and a second time division multiplexer 12, which are connected in order;

a seventh multiplier 6 and an eighth multiplier 9 connected in order;

a pseudo-code generator 1 connected to the first multiplier 3, the fourth multiplier 2, and the seventh multiplier 6;

a first frequency divider 17 connected to the pseudo-code generator 1;

a subcarrier generator connected to the second multiplier 7, the fifth multiplier 8, and the eighth multiplier 9;

a second frequency divider 18 connected to the first time division multiplexer 11 and the second time division multiplexer 12;

the first multiplier 3 is connected to the second adder 5; the fourth multiplier 2 is connected to the first subtracter 4; the eighth multiplier 9 is connected to the second time division multiplexer 12; the first time division multiplexer 11 and second time division multiplexer 12 are connected to a RF modulator; the first time division multiplexer 11 receives zero signal input.

The invention further provides a system for modulating navigation signal according the above-mentioned method. The system comprises:

a frequency divider 24 and a pseudo-code generator 19, which are connected; the pseudo-code generator 19 is connected to a first input terminal of a baseband modulation module 26 through a first Exclusive-OR operator 20; the pseudo-code generator 19 is connected to a second input terminal of the baseband modulation module 26 through a second Exclusive-OR operator 21; the pseudo-code generator 19 is also connected to a third input terminal of the baseband modulation module 26; the two output terminals of TD-AltBOC baseband modulation module 26 are connected to a RF modulator.

Advantages of the invention are summarized as follows.

The time-domain characteristics of TD-AltBOC modulating signal in the invention are as follows: within the odd time slot, the baseband wave form at I and Q branch is decided by the pseudo-code $c_{BD}$ of data channel of the upper sideband and the pseudo-code $c_{AD}$ of data channel of the lower sideband; when $C_{BD}=0$ and $C_{AD}=0$, the baseband wave form at I branch appears as binary cosine subcarrier, and the baseband wave form at Q branch is 0; when $C_{BD}=1$ and $C_{AD}=1$, the baseband wave form at I branch appears as reverse binary cosine subcarrier, and the baseband wave form at Q branch is 0; when $C_{BD}=0$ and $C_{AD}=1$, the baseband wave form at I branch is 0, and the baseband wave form at Q branch appears as binary sine subcarrier; when $C_{BD}=1$ and $C_{AD}=0$, the baseband wave form at I branch is 0, and the baseband wave form at Q branch appears as reverse binary sine subcarrier. Within the even time slot, the baseband wave form at Q branch is 0, and the baseband wave form at I branch is decided by the pseudo-code $C_P$ of pilot channel; when $C_P=0$, the baseband wave form at I branch appears as binary cosine subcarrier; when $C_P=1$, the baseband wave form at I branch appears as reverse binary cosine subcarrier. The baseband wave form of TD-AltBOC modulating signal is shown in FIG. 5. The baseband signal waveform of TD-AltBOC (15, 10) modulation is shown in FIG. 5.

The power spectrum of TD-AltBOC modulating signal comprises two main lobes; wherein, the spectral peak of one main lobe is located at where the carrier frequency is added to the subcarrier frequency; it is mainly the signal component of the upper sideband. The spectral peak of the other main lobe is located at where the carrier frequency is subtracted by the subcarrier frequency; it is mainly the signal component of the lower sideband. The normalized power spectrum of TD-AltBOC (15, 10) modulating signal is shown in FIG. 6.

TD-AltBOC modulating signal possesses favorable flexibility in reception. Signal of the upper sideband can be taken as the BPSK (Rc) modulating signal of which the center frequency is equal to the carrier frequency plus subcarrier frequency; signal of the lower sideband can be taken as the BPSK (Rc) modulating signal of which the center frequency is equal to the carrier frequency subtracted by subcarrier frequency. Signal of the upper and lower sidebands can be respectively received, thereby obtaining the receptivity equivalent to BPSK (Rc); signal of the upper and lower sidebands can also be received jointly, thereby obtaining the receptivity equivalent to BOC (fs, Rc).

TD-AltBOC modulating signal possesses 100% multiplexing efficiency. Adopting time division technique can realize the constant envelope multiplexing of the 4 signal components at the upper and lower sidebands; the product signal component is not introduced, so there is no multiplexing loss.

As for complexity, the pilot channels of upper and lower sidebands of TD-AltBOC share the same pseudo-code, joint receiving of the double side band is equivalent to cosine BOC modulation, and the number of pseudo-code generator and correlator required by pilot signal track can be halved; the conversion rate of TD-AltBOC subcarrier symbol is four times of the subcarrier frequency, while the conversion rate of AltBOC subcarrier symbol is eight times of the subcarrier frequency; the baseband processing rate for signal generation is halved; the waveform of TD-AltBOC subcarrier is 2 level; the waveform of AltBOC subcarrier is 4 level; fewer hardware resources will be consumed by a single correlator during matched receiving; during the time-sharing appearance of data channel and pilot channel of TD-AltBOC modulating signal, some elementary units (such as multiplier) which consume more hardware resources can realize time-sharing multiplexing, thereby improving the resource utilization rate and reducing the consumption of hardware resources. Therefore, the complexity of generation and receiving of TD-AltBOC signal is far below that of AltBOC signal.

DETAILED DESCRIPTION OF THE EMBODIMENTS

The invention combines the TDM mode by chip and 2-signal AltBOC modulation system, which solves the problem in 4-signal constant envelope modulation; it is named as Time Division AltBOC mode, short for TD-AltBOC.

I. TD-AltBOC Principle

Parameter definition of TD-AltBOC (m, n) modulation: m refers to the multiple of f0, the relative reference frequency of subcarrier frequency, namely $f_s=m\times f_0$; n refers to the multiple of f0, relative reference frequency of code rate, namely, $R_c=n\times f_0$.

TD-AltBOC modulation divides the signal transmission time into odd and even time slots. The time slot width equals to the pseudo-code chip width. The odd time slot transmits the signal component of data channel of the upper and lower sidebands; and, the even time slot transmits the signal component of pilot channel of the upper and lower sidebands. The sequential relationship for signal component transmission is shown in FIG. 1.

Figure 1:
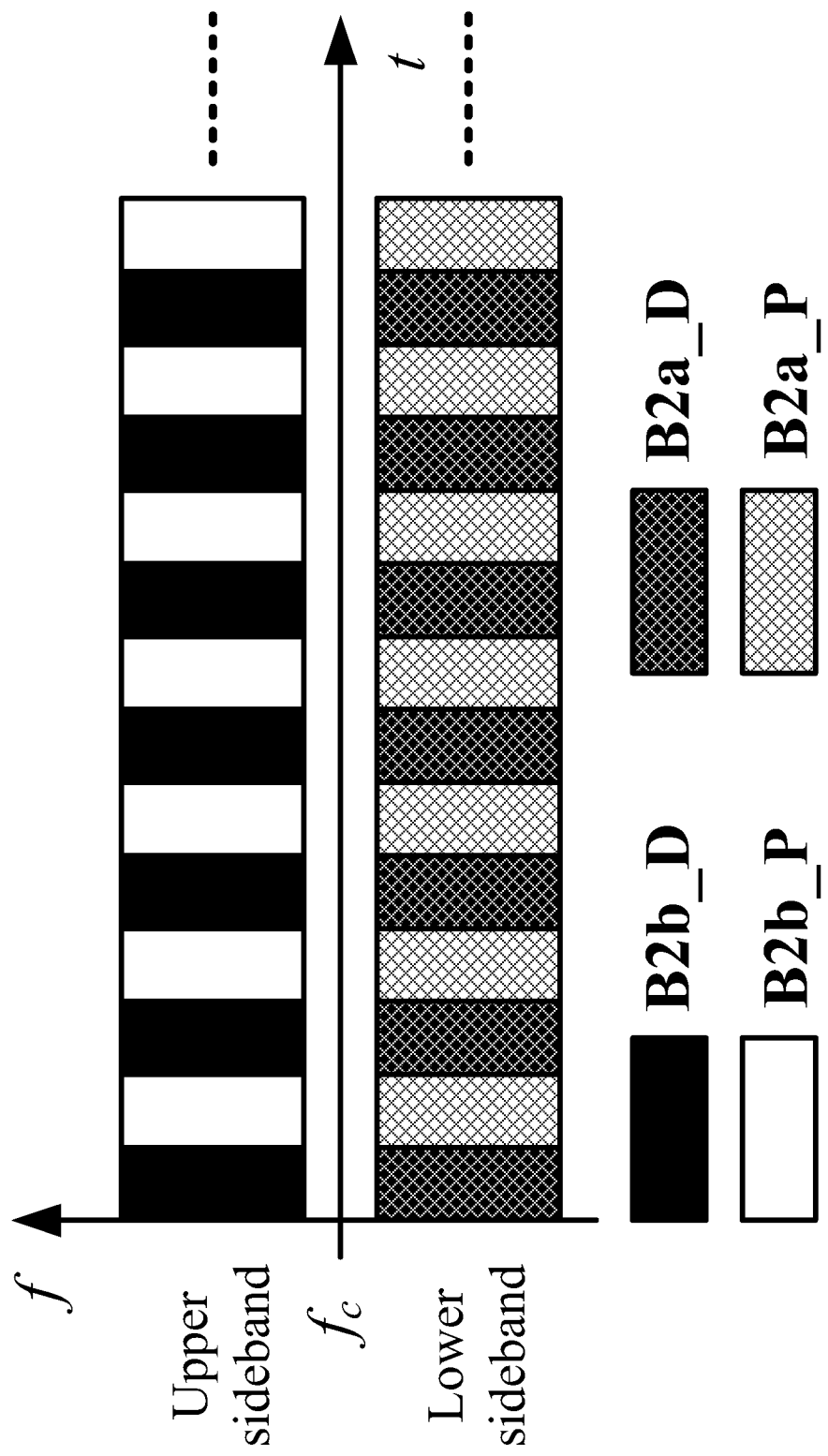
FIG. 1 shows sequential relationship of transmission of TD-AltBOC signal components.

In FIG. 1, B2b_D refers to the signal component of data channel of the upper sideband; B2b_P refers to the signal component of pilot channel of the upper sideband; B2a_D refers to the signal component of data channel of the lower sideband; B2a_P refers to the signal component of pilot channel of the lower sideband.

The mathematical representation of TD-AltBOC modulating baseband signal is $$s(t)=[d_A(t)c_{AD}(t)+c_{AP}(t)][SC_{b,cos}(t)-jSC_{b,sin}(t)]+[d_B(t)c_{BD}(t)+c_{BP}(t)][SC_{B,cos}(t)+jSC_{B,sin}(t)]$$

wherein, $d_A(t)$ is the data bit waveform of modulation of data channel of the lower sideband; $c_{AD}(t)$ is the pseudo-code waveform of data channel of the lower sideband; $c_{AP}(t)$ is the pseudo-code waveform of data channel of the lower sideband; $d_B(t)$ is the data bit waveform of modulation of data channel of the upper sideband; $c_{BD}(t)$ is the pseudo-code waveform of data channel of the upper sideband; $c_{BP}(t)$ is the pseudo-code waveform of data channel of the upper sideband; $SC_{B,cos}(t)$ is binary cosine subcarrier; $SC_{B,sin}(t)$ is binary sine subcarrier. They are:

$$c_{AD}(t)=\sum_{l=-\infty}^{\infty}\sum_{k=0}^{N_{AD}-1} C_{AD}(k)p(t-(2N_{AD}l+2k)T_c)$$

$$c_{AP}(t)=\sum_{l=-\infty}^{\infty}\sum_{k=0}^{N_{AP}-1} C_{AP}(k)p(t-(2N_{AP}l+2k+1)T_c)$$

$$c_{BD}(t)=\sum_{l=-\infty}^{\infty}\sum_{k=0}^{N_{BD}-1} C_{BD}(k)p(t-(2N_{BD}l+2k)T_c)$$

$$c_{BP}(t)=\sum_{l=-\infty}^{\infty}\sum_{k=0}^{N_{BP}-1} C_{BP}(k)p(t-(2N_{BP}+2k+1)T_c)$$

$$SC_{B,cos}(t)=\text{sign}(\cos(2\pi f_s t))$$

$$SC_{B,sin}(t)=\text{sign}(\sin(2\pi f_s t))$$

wherein, $C_{AD}$ is the pseudo-code sequence of data channel of the lower sideband (take±1); $C_{AP}$ is the pseudo-code sequence of pilot channel of the lower sideband; $C_{BD}$ is the pseudo-code sequence of data channel of the upper sideband; $c_{BP}$ is the pseudo-code sequence of pilot channel of the upper sideband; $N_{AD}$, $N_{AP}$, $N_{BD}$ and $N_{BP}$ are respectively the code length of $C_{AD}$, $C_{AP}$, $C_{AP}$ and $C_{BP}$; $T_c$ is the pseudo-code chip width; p(t) is square topped pulse; sign(•) means the symbolic operation; $f_s$ is subcarrier frequency (B2 signal is 15×1.023 MHz). p(t) is defined as follows $$p(t)=\begin{cases} 1 & 0\leq\tilde{t}<T_c \\ 0 & \text{others}\end{cases}$$

Figure 4:
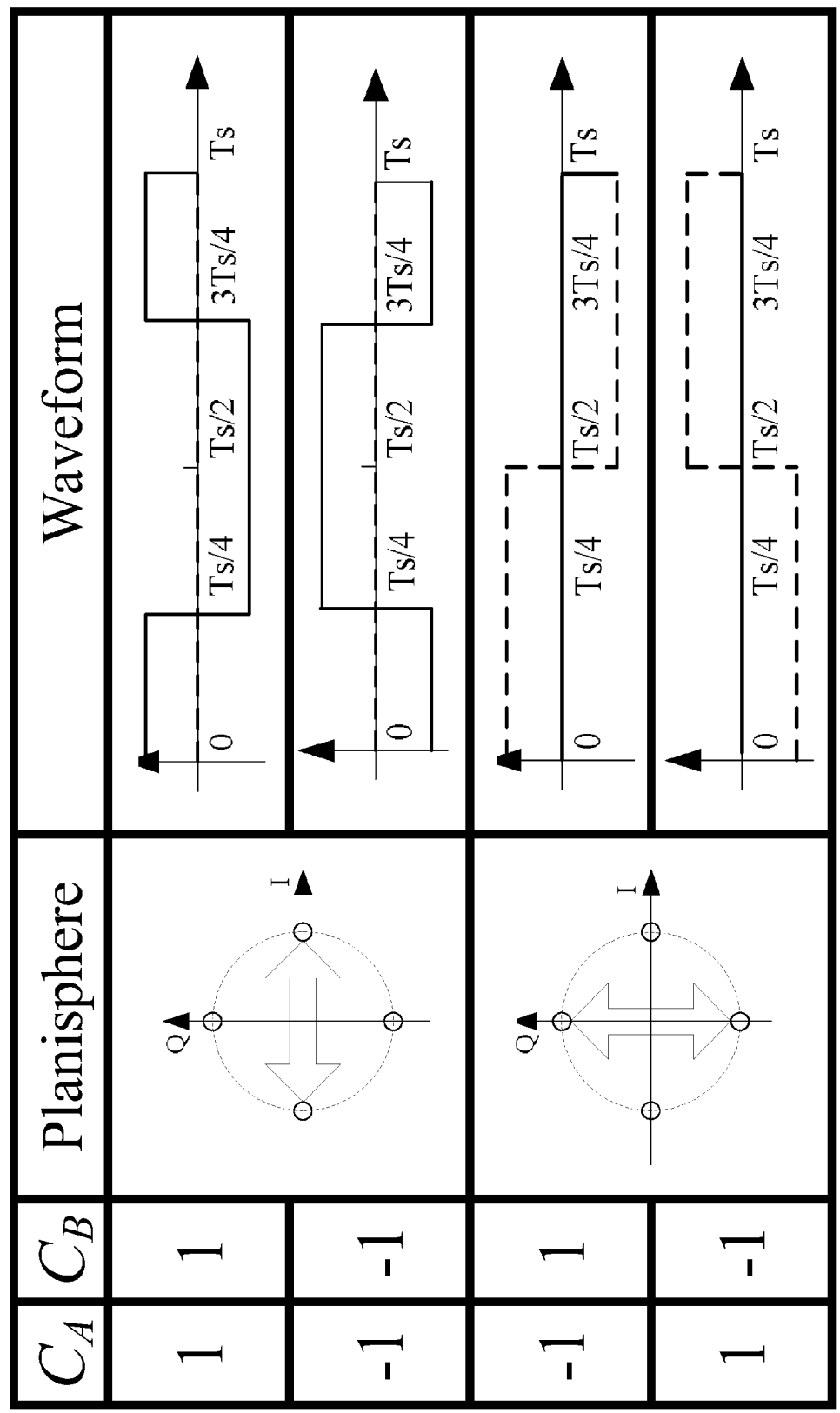
FIG. 4 shows planisphere and waveform of TD-AltBOC modulation.
Figure 5:
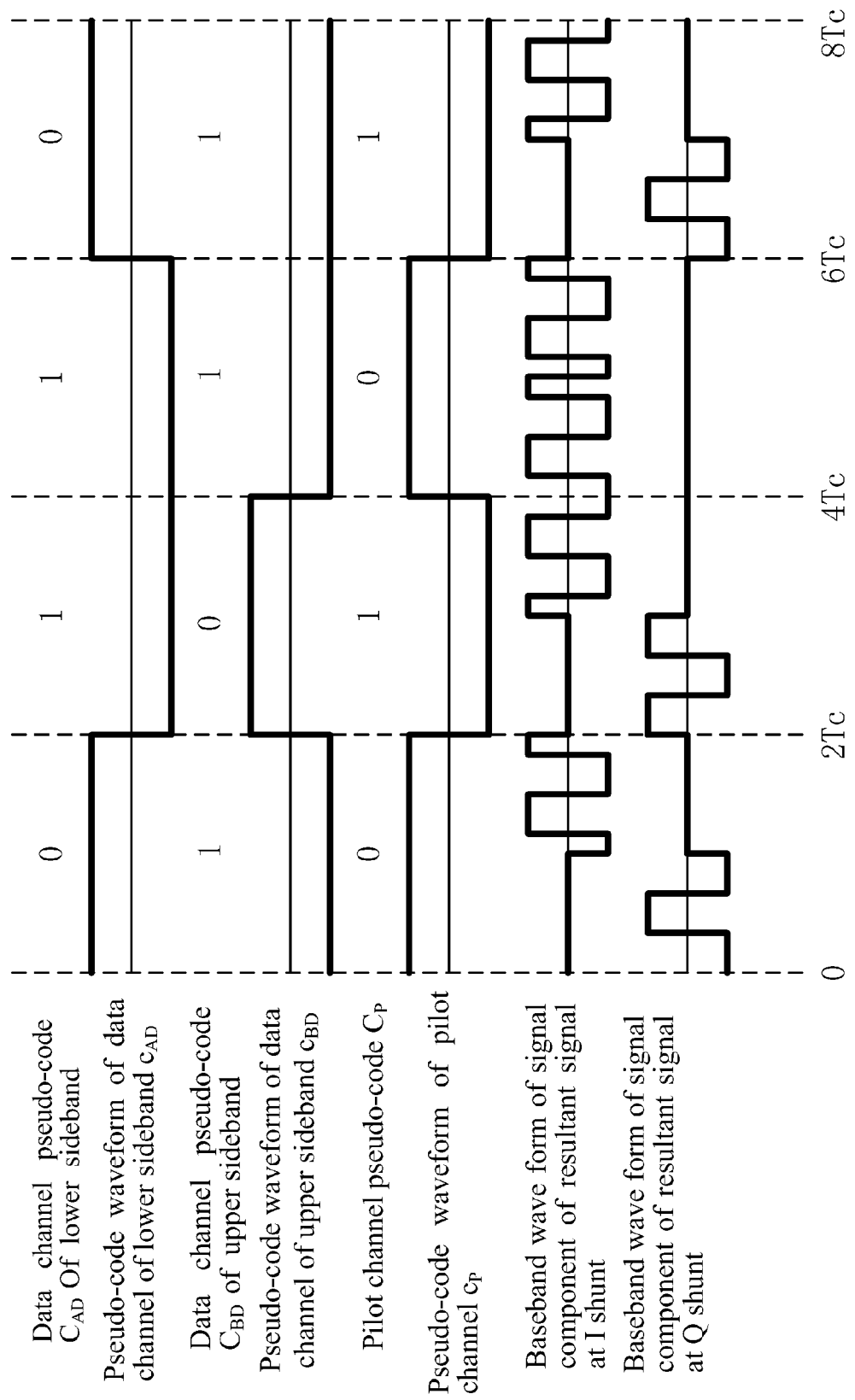
Figure 6:
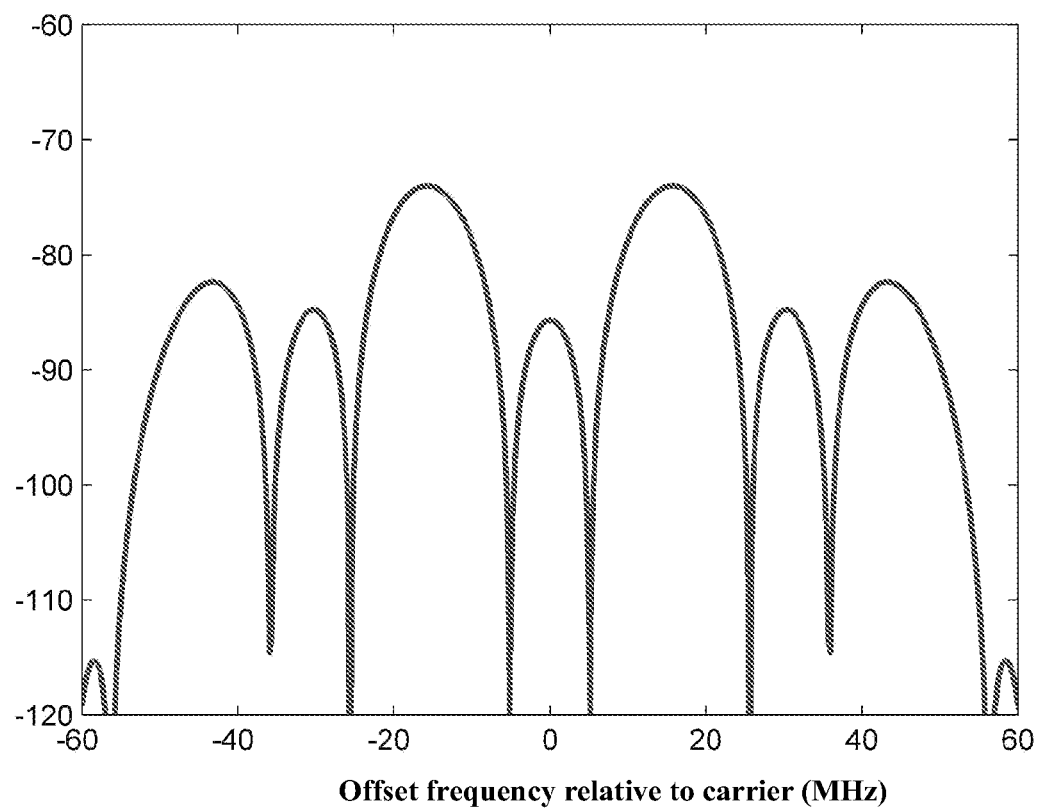

The planisphere and signal waveform of TD-AltBOC modulating signal are shown in FIG. 4.

In FIG. 4, $C_A$ and $C_B$ respectively refer to the pseudo-code of lower sideband and upper sideband transmitted in a certain time slot. When the present time slot is odd time slot, $C_A=d_A C_{AD}$, $C_B=d_B C_{BD}$; when the present time slot is even time slot, $C_A=C_{AP}$, $C_B=C_{BP}$. The signal waveform depicted in real line is same-phase branch waveform; the signal waveform depicted in dotted line is perpendicular branch waveform.

If the upper and lower sidebands adopt the same code sequence, namely $C_{AP}=C_{BP}$, the expression of TD-AltBOC modulating baseband signal is $$s(t)=[d_A(t)c_{AD}(t)+d_B(t)c_{BD}(t)]SC_{B,cos}(t)+j[-d_A(t)c_{AD}(t)+d_B(t)c_{BD}(t)]SC_{B,sin}(t)+2c_{BP}(t)SC_{B,cos}(t)$$

Namely, in even time slot, there will only be binary cosine subcarrier on the same-phase branch.

If the upper and lower sidebands adopt the reverse code sequence, namely $C_{AP}=-C_{BP}$, the expression of TD-AltBOC modulating baseband signal is $$s(t)=[d_A(t)c_{AD}(t)+d_B(t)c_{BD}(t)]SC_{B,cos}(t)+j[-d_A(t)c_{AD}(t)+d_B(t)c_{BD}(t)]SC_{B,sin}(t)+2jc_{BP}(t)SC_{B,sin}(t)$$

Namely, in even time slot, there will only be binary sine subcarrier on the perpendicular branch.

In order to reduce the complexity in signal reception and processing and optimize the receptivity, the invention adopts the TD-AltBOC programme with the same pseudo-code of pilot channel on the upper and lower sidebands. The mathematical representation is $$s(t)=[d_A(t)c_{AD}(t)+d_B(t)c_{BD}(t)]SC_{B,cos}(t)+j[-d_A(t)c_{AD}(t)+d_B(t)c_{BD}(t)]SC_{B,sin}(t)+2c_P(t)SC_{B,cos}(t) \quad (1)$$

When $2f_x \cdot T_c$ is an odd number, the normalized power spectrum of TD-AltBOC signal is $$G_{TD\text{-}AltBOC}^{odd,+}(f)=\frac{R_c}{(\pi f)^2}\cos^2\left(\frac{\pi f}{R_c}\right)\frac{\sin^2\left(\frac{\pi f}{4f_s}\right)}{\cos^2\left(\frac{\pi f}{2f_s}\right)}\left(2-\cos\left(\frac{\pi f}{2f_s}\right)\right) \quad (2)$$

When $2f_x \cdot T_c$ is an even number, the normalized power spectrum of TD-AltBOC signal is $$G_{TD\text{-}AltBOC}^{even,+}(f)=\frac{R_c}{(\pi f)^2}\sin^2\left(\frac{\pi f}{R_c}\right)\frac{\sin^2\left(\frac{\pi f}{4f_s}\right)}{\cos^2\left(\frac{\pi f}{2f_s}\right)}\left(2-\cos\left(\frac{\pi f}{2f_s}\right)\right) \quad (3)$$

II. Signal Generation Process

Figure 2:
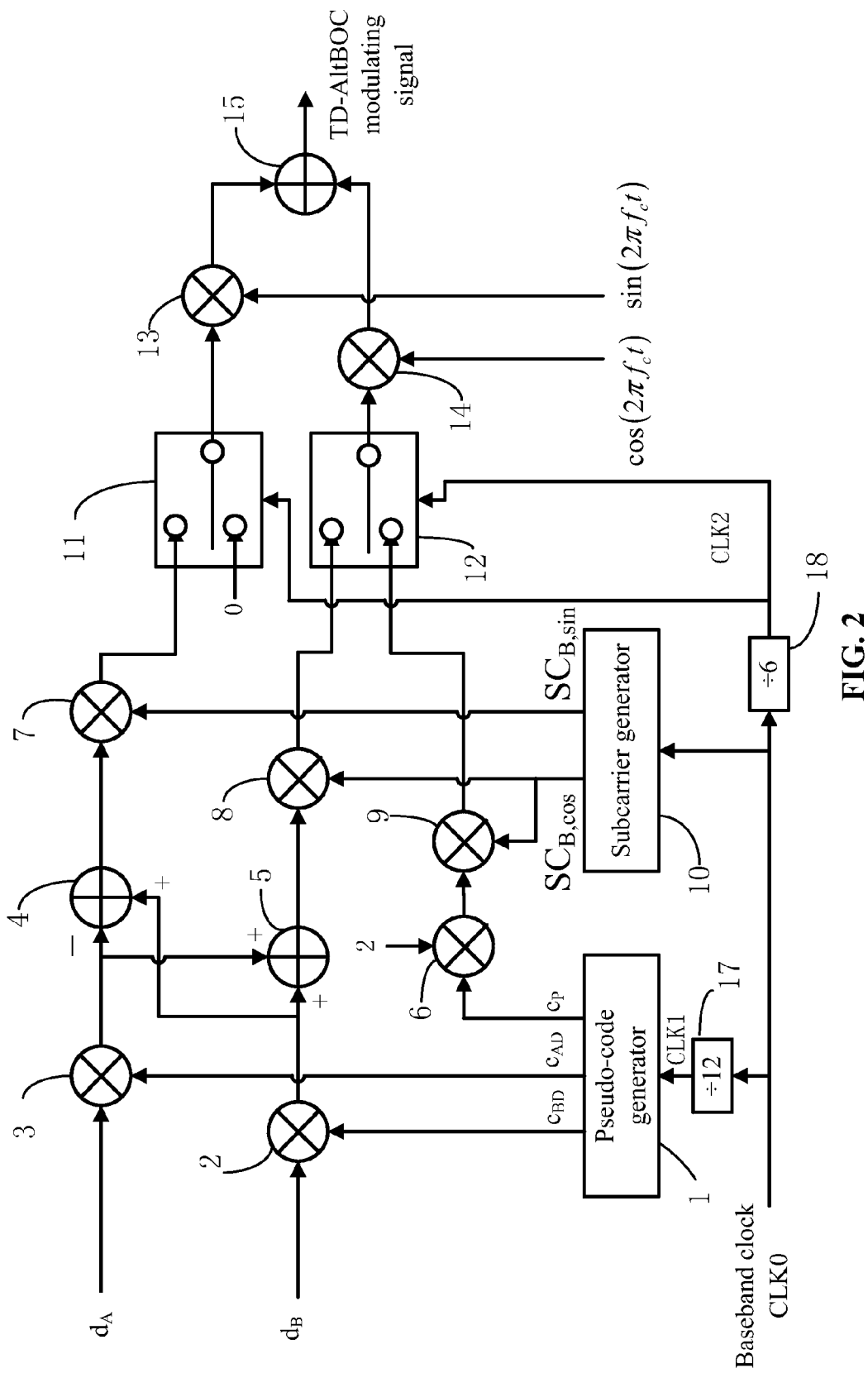
FIG. 2 shows a diagram of generation of TD-AltBOC modulating signal.

FIG. 2 is an example of TD-AltBOC (15, 10) signal generation of which the reference frequency f0=1.023 MHz; it contains the following procedures:

The clock which is 4 times of the subcarrier frequency is taken as the clock signal CLK0 for integrating control generated by TD-AltBOC baseband signal.

1) The control clock frequency is divided by 12 through the frequency divider 17 to generate the drive clock CLK1 of pseudo-code generator.

2) The pseudo-code $c_{BD}$ of data channel of the upper sideband (+1 or −1), pseudo-code $c_{AD}$ of data channel of the lower sideband (+1 or −1) and the pseudo-code $c_P$ of pilot channel of the lower sideband (+1 or −1) are generated via half of the code rate Rc.

3) The binary NRZ waveform $d_A$ of the lower sideband data (1 refers to data bit 0; −1 refers to data bit 1) is multiplied by pseudo-code $c_{AD}$ of the data channel of the lower sideband through the multiplier 3.

4) The binary NRZ waveform $d_B$ of the upper sideband data (1 refers to data bit 0; −1 refers to data bit 1) is multiplied by pseudo-code $c_{BD}$ of the data channel of the upper sideband through the multiplier 2.

5) After reverse sign of the output of multiplier 3, it is added to the output of multiplier 2 through adder 4 (equivalent to subtracter).

6) The output of multiplier 3 is added to the output of multiplier 2 through adder 5.

7) The pseudo-code output of pilot channel of the pseudo-code generator is multiplied by 2 through the multiplier 6.

8) CLK0 is used to drive subcarrier generator to generate binary sine subcarrier $SC_{B,sin}$ and binary cosine subcarrier $SC_{B,cos}$.

9) The output of multiplier 6 is multiplied by binary cosine subcarrier $SC_{B,cos}$ through multiplier 9 to get the signal component of pilot channel at I branch; the signal component of pilot channel at Q branch is constantly 0.

10) The output of adder 5 is multiplied by binary cosine subcarrier $SC_{B,cos}$ through multiplier 8 to get the signal component of data channel at I branch.

11) The output of adder 4 is multiplied by binary sine subcarrier $SC_{B,sin}$ through multiplier 7 to get the signal component of data channel at Q branch.

12) The output of multiplier 7 and 0 are taken as the two inputs of time division multiplexer 11.

13) The output of multiplier 8 and output of multiplier 9 are taken as the two inputs of time division multiplexer 12.

14) Frequency of the baseband clock CLK0 is divided by 6 through the frequency divider 18 to get the time division multiplexer control clock CLK2.

15) Under the control of clock CLK2, the time division multiplexer 11 and time division multiplexer 12 finish the synchronous switching of data channel and pilot channel; in the odd chip time slot, the time division multiplexer 11 outputs the signal component of data channel at Q branch, and time division multiplexer 12 outputs the signal component of data channel at I branch; in the even chip time slot, the time division multiplexer 11 outputs 0, and time division multiplexer 12 outputs the signal component of pilot channel at I branch; The output of time division multiplexer 11 is the signal component of resultant signal at Q branch; the output of time division multiplexer 12 is the signal component of resultant signal at I branch.

16) Time division multiplexer 11 is used to output the modulated sine phase carrier of baseband signal at Q branch to get the component of radio-frequency signal at Q branch.

17) Time division multiplexer 12 is used to output the modulated cosine phase carrier of baseband signal at Q branch to get the component of radio-frequency signal at I branch.

18) The component of radio-frequency signal at Q branch and component of radio-frequency signal at I branch are integrated to get TD-AltBOC modulated radio frequency signal.

In the example, the multipliers 13 and 14 and adder 15 constitute the RF modulator together. The invention is not limited to this form. It can also use a special QPSK modulator to realize radio frequency modulation; the number of frequency division of the frequency dividers 17 and 18 is also not restricted to the number of frequency division referred to in the example. When the subcarrier frequency and controlling parameters of code rate are changed, the number of frequency division of frequency dividers 17 and 18 shall also be changed. The number of frequency division of frequency divider 17 is 8*m/n, and the number of frequency division of frequency divider 18 is 4*m/n.

III. A Preferred TD-AltBOC Implementation Plan

Figure 3:
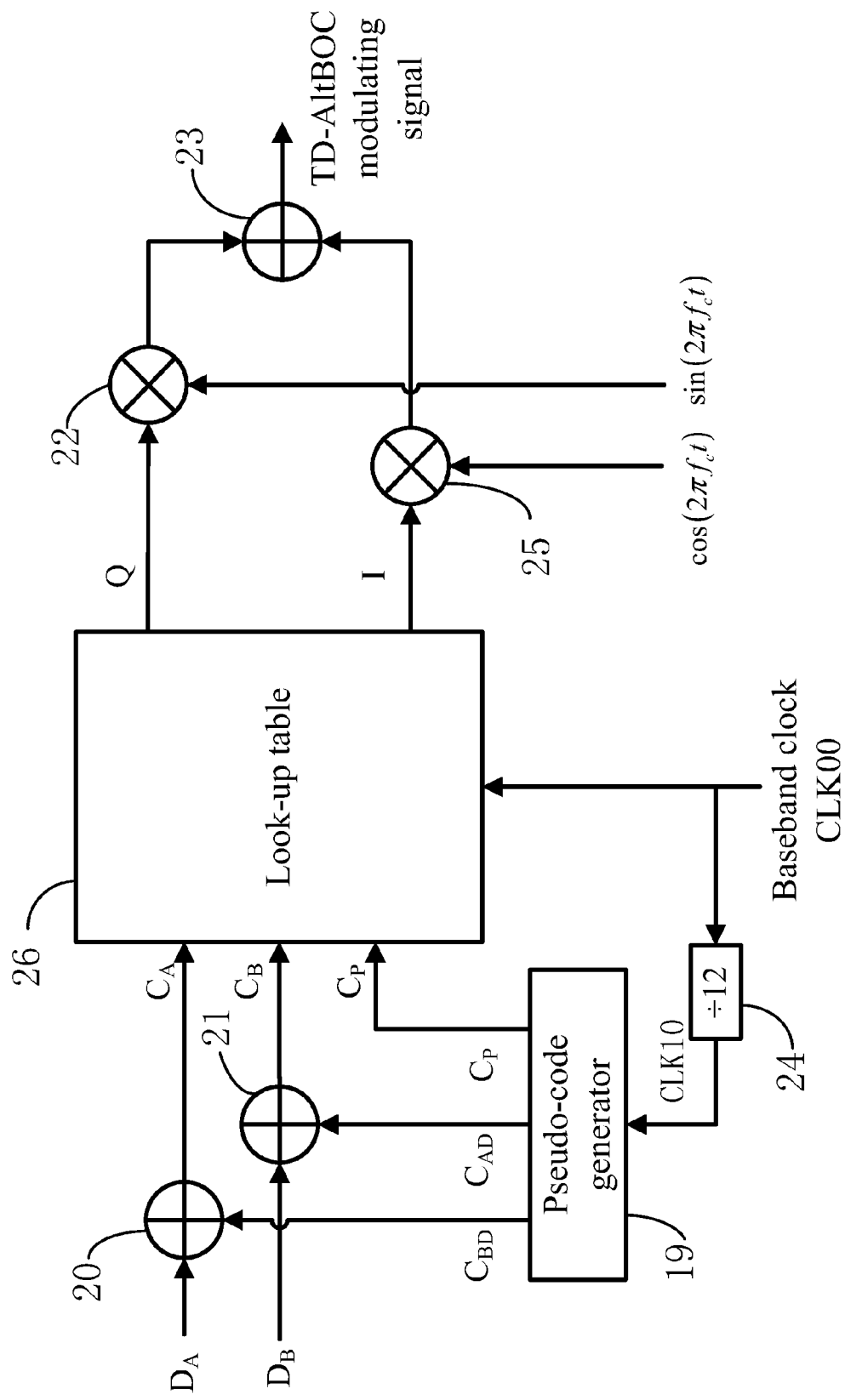
FIG. 3 shows the generation of TD-AltBOC modulating signal.

As is shown in FIG. 3, it includes the following procedures:

1) The baseband clock CLK00 is used as the drive clock of TD-AltBOC modulation.

2) Frequency of clock CLK00 is divided by 12 through frequency divider 24 to be the drive clock of pseudo-code generator.

3) The pseudo-code generator generates the pseudo-code $c_{BD}$ of data channel of the upper sideband and the pseudo-code $c_{AD}$ of data channel and pseudo-code cp of pilot channel of the lower sideband via half of the code rate Rc; different from the method shown in FIG. 2, the value of pseudo-code sequence output in this method is selected as 0 or 1, which are respectively corresponding to 1 and −1 in the method shown in FIG. 2.

4) The lower sideband data $D_A$ and pseudo-code $c_{AD}$ of data channel of the lower sideband are subject to exclusive-or operation with binary adder 20 to get the compound code $C_A$ of the data channel of the lower sideband.

5) The upper sideband data $D_B$ and pseudo-code $c_{BD}$ of data channel of the upper sideband are subject to exclusive-or operation with binary adder 21 to get the compound code $C_B$ of the data channel of the upper sideband.

6) The data channel compound code $C_A$ of lower sideband, data channel compound code $C_B$ of upper sideband and pseudo-code $c_P$ of pilot channel of upper sideband are taken as the input of table lookup unit 26 to search the corresponding amplitude sequence of I and Q component, and get the baseband wave form at I branch and baseband wave form at Q branch through pulse modulation. The table lookup unit 26 comprises the modulation mapping table comprising a lookup table at I branch and a lookup table at Q branch, which are shown in table 1 and table 2 respectively.

7) The baseband wave form at Q branch is used to modulate the sine phase carrier, and baseband wave form at I branch is used to modulate the cosine carrier wave to output TD-AltBOC modulating signal.

TABLE 1

| Lookup table for I branch | | | | | | | | | | | | | | |
|---|---|---|---|---|---|---|---|---|---|---|---|---|---|---|
| Input | | | Output (I) | | | | | | | | | | | |
| $C_A$ | $C_B$ | $C_P$ | 1 | 2 | 3 | 4 | 5 | 6 | 7 | 8 | 9 | 10 | 11 | 12 |
| 0 | 0 | 0 | 1 | −1 | −1 | 1 | 1 | −1 | −1 | 1 | 1 | −1 | −1 | 1 |
| 0 | 0 | 1 | 1 | −1 | −1 | 1 | 1 | −1 | 1 | −1 | −1 | 1 | 1 | −1 |
| 0 | 1 | 0 | 0 | 0 | 0 | 0 | 0 | 0 | −1 | 1 | 1 | −1 | −1 | 1 |
| 0 | 1 | 1 | 0 | 0 | 0 | 0 | 0 | 0 | 1 | −1 | −1 | 1 | 1 | −1 |
| 1 | 0 | 0 | 0 | 0 | 0 | 0 | 0 | 0 | 1 | 1 | −1 | −1 | 1 | 1 |
| 1 | 0 | 1 | 0 | 0 | 0 | 0 | 0 | 0 | 1 | −1 | −1 | 1 | 1 | −1 |
| 1 | 1 | 0 | −1 | 1 | 1 | −1 | −1 | 1 | 1 | 1 | −1 | −1 | 1 | 1 |
| 1 | 1 | 1 | −1 | 1 | 1 | −1 | −1 | 1 | 1 | −1 | −1 | 1 | 1 | −1 |

TABLE 2

Lookup table for Q branch

| Input | | | Output (Q) | | | | | | | | | | | |
|---|---|---|---|---|---|---|---|---|---|---|---|---|---|---|
| $C_A$ | $C_B$ | $C_P$ | 1 | 2 | 3 | 4 | 5 | 6 | 7 | 8 | 9 | 10 | 11 | 12 |
| 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 |
| 0 | 1 | 0 | −1 | −1 | 1 | 1 | −1 | −1 | 0 | 0 | 0 | 0 | 0 | 0 |
| 0 | 1 | 1 | −1 | −1 | 1 | 1 | −1 | −1 | 0 | 0 | 0 | 0 | 0 | 0 |
| 1 | 0 | 0 | 1 | 1 | −1 | −1 | 1 | 1 | 0 | 0 | 0 | 0 | 0 | 0 |
| 1 | 0 | 1 | 1 | 1 | −1 | −1 | 1 | 1 | 0 | 0 | 0 | 0 | 0 | 0 |
| 1 | 1 | 0 | 0 | 0 | 0 | 0 | 0 | 0 | 0 | 0 | 0 | 0 | 0 | 0 |
| 1 | 1 | 1 | 0 | 0 | 0 | 0 | 0 | 0 | 0 | 0 | 0 | 0 | 0 | 0 |

Establishment of table 1 and table 2 is based on the subcarrier modulation theory in FIG. 2, that is to say, all the possible $C_A$, $C_B$ and $C_P$ values are combined, and each combination is subject to subcarrier modulation in the same way, thereby obtaining the baseband signal component at Q branch and at I branch corresponding to each combination; record each combination and its corresponding component at Q branch and at I branch to get the modulation mapping table.

Table 1 and table 2 are established based on TD-AltBOC (15, 10) modulation, and it is suitable when fs/Rc=1.5; under other circumstances, the tables can be established in the following way:

(1) $C_A$, $C_B$, $C_P$ is mapped as $c_A, c_B, c_P$ according to the following rule:

$$f(x) = \begin{cases} 1 & \text{when } x = 0 \\ -1 & \text{when } x = 1 \end{cases}$$

(2) When n takes 0, 1, . . . , 4fs/Rc−1, the output $S_I$ at I branch and output $S_Q$ at Q branch can be calculated according to the following formula $$S_I(n) = (c_A + c_B) \times \text{sign}\left(\cos\left(\frac{\pi}{4} + \frac{n\pi}{2}\right)\right)$$
$$S_Q(n) = (c_A + c_B) \times \text{sign}\left(\sin\left(\frac{\pi}{4} + \frac{n\pi}{2}\right)\right)$$

When n takes 4fs/Rc, . . . , 4fs/Rc−1, the output $S_I$ at I branch and output $S_Q$ at Q branch can be calculated according to the following formula $$S_I(n) = 2c_P \times \text{sign}\left(\cos\left(\frac{\pi}{4} + \frac{n\pi}{2}\right)\right)$$
$$S_Q(n) = 0.$$

The invention claimed is:

1. A method for modulating navigation signal, the method comprising the following steps:

1) dividing frequency of a control clock CLK0 to obtain a pseudo-code generating drive clock CLK1 and a time division multiplexing (TDM) control clock CLK2 by utilizing a first frequency divider and a second frequency divider, respectively, where, a frequency of the control clock CLK0 is four times that of a binary subcarrier, a frequency of the pseudo-code generating drive clock CLK1 is ½ of a code rate, and a frequency of the TDM control clock CLK2 is equivalent to the code rate;

2) driving the CLK1 to generate pseudo-code $c_{BD}$ of a data channel of an upper sideband, pseudo-code $c_{AD}$ of a data channel of a lower sideband, and pseudo-code Cp of a pilot channel by utilizing a pseudo-code generator; driving the CLK0 to generate a binary sine subcarrier $SC_{B,sin}$ and a binary cosine subcarrier $SC_{B,cos}$ by utilizing a subcarrier generator;

3) modulating the $c_{AD}$ by a lower sideband $d_A$ to generate a baseband signal component $C_A$ of the data channel of the lower sideband by utilizing a first multiplier; modulating the $c_{BD}$ by an upper sideband waveform $d_B$ to generate a baseband signal component $C_B$ of the data channel of the upper sideband by utilizing a fourth multiplier;

4) modulating the subcarriers, which comprises:

(4.1) negating the $C_A$ and adding to the $C_B$, and multiplying with the $SC_{B,sin}$ to get a signal component of data channel at Q branch by utilizing a subtracter and a second multiplier; adding the $C_A$ to the $C_B$ and multiplying with the $SC_{B,cos}$ to get a signal component of data channel at I branch by utilizing a second adder and a fifth multiplier; multiplying the $C_P$ by 2 and then multiplying with the $SC_{B,cos}$ to get a signal component of the pilot channel at I branch by utilizing a seventh multiplier and an eighth multiplier; and (4.2) when the CLK2 is in a time slot of odd chip, allowing the signal component of the data channel at Q branch to be a signal component of a baseband signal at Q branch by utilizing a first time division multiplexer, and allowing the signal component of the data channel at I branch to be a signal component of a baseband signal at I branch by utilizing a second time division multiplexer; when CLK2 is in a time slot of even chip, allowing zero signal to be the signal component of the baseband signal at Q branch by utilizing the first time division multiplexer, and allowing the signal component of the pilot channel at I branch to be the signal component of the baseband signal at I branch by utilizing the second time division multiplexer; and 5) modulating a sine phase carrier by the signal component of the baseband signal at Q branch, modulating a cosine phase carrier by the signal component of the baseband signal at I branch, and combining the modulation result of the two branches to obtain a modulated radio frequency signal by utilizing an RF modulator.

2. The method of claim 1, wherein in step (4), corresponding baseband signal components at Q branch and I branch are looked up in a modulation mapping table according to the current $C_A$, $C_B$, and $C_p$ value by utilizing a baseband modulation module; a method to establish the modulation mapping table comprises: combining all possible $C_A$, $C_B$ and $C_p$ values and processing each combination thereof according to steps (4.1)-(4.2) to get the baseband signal component at Q branch and I branch corresponding to each combination, and recording each combination and corresponding Q branch component and I branch component thereof in the baseband modulation module to establish the modulation mapping table.

3. A system for modulating navigation signal according the method of claim 1, the system comprising:

a) a first multiplier (3), a first subtracter (4), a second multiplier (7), and a first time division multiplexer (11), which are connected in order;

b) a fourth multiplier (2), a second adder (5), a fifth multiplier (8), and a second time division multiplexer (12), which are connected in order;

c) a seventh multiplier (6) and an eighth multiplier (9) connected in order;

d) a pseudo-code generator (1) connected to the first multiplier (3), the fourth multiplier (2), and the seventh multiplier (6);
e) a first frequency divider (17) connected to the pseudo-code generator (1);
f) a subcarrier generator connected to the second multiplier (7), the fifth multiplier (8), and the eighth multiplier (9); and
g) a second frequency divider (18) connected to the first time division multiplexer (11) and the second time division multiplexer (12);

wherein
the first multiplier (3) is connected to the second adder (5);
the fourth multiplier (2) is connected to the first subtracter (4);
the eighth multiplier (9) is connected to the second time division multiplexer (12);
the first time division multiplexer (11) and second time division multiplexer (12) are connected to a RF modulator; and
the first time division multiplexer (11) receives zero signal input.

4. A system for modulating navigation signal according the method of claim 2, the system comprising: a frequency divider (24) and a pseudo-code generator (19); wherein
the frequency divider (24) and the pseudo-code generator (19) are connected;
the pseudo-code generator (19) is connected to a first input terminal of a baseband modulation module (26) through a first Exclusive-OR operator (20);
the pseudo-code generator (19) is connected to a second input terminal of the baseband modulation module (26) through a second Exclusive-OR operator (21);
the pseudo-code generator (19) is also connected to a third input terminal of the baseband modulation module (26);
two output terminals of the baseband modulation module (26) are connected to a RF modulator.

* * * * *